(12) United States Patent
Park et al.

(10) Patent No.: US 12,283,974 B2
(45) Date of Patent: Apr. 22, 2025

(54) SYSTEM AND METHOD FOR DISTRIBUTION STORAGE OF BLOCKCHAIN TRANSACTION DATA BASED ON ERASURE CODE

(71) Applicant: ELECTRONICS AND TELECOMMUNICATIONS RESEARCH INSTITUTE, Daejeon (KR)

(72) Inventors: Sohyun Park, Daejeon (KR); Myungcheol Lee, Daejeon (KR); Beongjun Choi, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 18/397,612

(22) Filed: Dec. 27, 2023

(65) Prior Publication Data

US 2024/0283466 A1 Aug. 22, 2024

(30) Foreign Application Priority Data

Feb. 20, 2023 (KR) .......................... 10-2023-0022080

(51) Int. Cl.
*H03M 13/15* (2006.01)
*H03M 13/29* (2006.01)
*H04L 67/1097* (2022.01)

(52) U.S. Cl.
CPC ..... *H03M 13/1515* (2013.01); *H03M 13/293* (2013.01); *H04L 67/1097* (2013.01)

(58) Field of Classification Search
None
See application file for complete search history.

(56) References Cited

U.S. PATENT DOCUMENTS 10,911,220 B1 * 2/2021 Zhuo .................... H04L 9/0637
11,023,314 B2 * 6/2021 Lu ......................... H04L 9/3236
(Continued)

FOREIGN PATENT DOCUMENTS

| KR | 10-1934204 B1 | 12/2018 |
| KR | 10-2021-0058746 A | 5/2021 |
| KR | 10-2022-0086677 A | 6/2022 |

OTHER PUBLICATIONS

W. Bao, L. Wang and J. Chen, "A Lightweight Locally Repairable Code-based Storage Architecture for Blockchains," 2022 IEEE Smartworld, Ubiquitous Intelligence & Computing, Scalable Computing & Communications, Haikou, China, 2022, pp. 2279-2283, (Year: 2022).*

(Continued)

*Primary Examiner* — Daniel F. McMahon
(74) *Attorney, Agent, or Firm* — Sughrue Mion, PLLC

(57) ABSTRACT

Provided is a method performed by a system for distribution storage of blockchain transaction data based on an erasure code. The method includes performing RS encoding on a predetermined number of blockchain transaction original data; and after the RS encoding is performed, applying LRC encoding technique to blockchain transaction original data (LRC-encoded original data), which needs to be accessed high speed, among the RS-encoded transaction original data to encode and store the LRC-encoded original data, and repairing the LRC-encoded original data through decoding.

18 Claims, 11 Drawing Sheets

(56) References Cited

U.S. PATENT DOCUMENTS

| | | | |
|---|---|---|---|
| 2015/0142863 A1* | 5/2015 | Yuen | H03M 13/13 |
| | | | 707/827 |
| 2018/0181471 A1* | 6/2018 | Panta | G06F 11/1076 |
| 2019/0286521 A1* | 9/2019 | Okpotse | G06F 11/1076 |
| 2019/0286531 A1* | 9/2019 | Lin | G06F 16/1824 |
| 2019/0347165 A1 | 11/2019 | Kim | |
| 2020/0310652 A1 | 10/2020 | Youn et al. | |
| 2021/0044422 A1* | 2/2021 | Lu | H04L 9/3239 |
| 2021/0208782 A1* | 7/2021 | Zhu | G06F 11/1076 |
| 2021/0271557 A1* | 9/2021 | Hao | G06F 11/1448 |

OTHER PUBLICATIONS

M. Schnjakin, T. Metzke and C. Meinel, "Applying Erasure Codes for Fault Tolerance in Cloud-RAID," 2013 IEEE 16th International Conference on Computational Science and Engineering, Sydney, NSW, Australia, 2013, pp. 66-75, (Year: 2013).*

Mi-Yeong Nam, et al., "Partial access recovery code for distributed storage systems", Information and Communications Magazine, May 29, 2015, pp. 3-8, vol. 32 Issue 6.

* cited by examiner

SYSTEM AND METHOD FOR DISTRIBUTION STORAGE OF BLOCKCHAIN TRANSACTION DATA BASED ON ERASURE CODE

CROSS-REFERENCE TO RELATED APPLICATION

This application claims priority to and the benefit of Korean Patent Application No. 10-2023-0022080, filed on Feb. 20, 2023, the disclosure of which is incorporated herein by reference in its entirety.

BACKGROUND

1. Field

The present invention relates to a system and method for distribution storage of blockchain transaction data based on an erasure code.

2. Description of Related Art

Blockchain is a distributed ledger management technology that records transaction information in all nodes participating in a network in a decentralized manner so that the transaction information may not be modified arbitrarily and may be viewed by anyone. Transactions generated in the blockchain network are recorded in the distributed ledger of all participating nodes in the form of blocks, so the same transaction information can be confirmed from all nodes in the blockchain network.

Since transaction blocks are generated including a hash value of a previous block, Byzantine fault tolerance (BFT) may be ensured when a predetermined number of nodes among all the participating nodes have the same data.

The existing blockchain ensures the BFT by storing transaction data redundantly in all participating nodes within the blockchain network. However, there is a problem in that the data storage capacity that each node should bear increases due to the redundant storage and irreversible characteristics of the blockchain.

SUMMARY

The present invention provides a system and method for distribution storage of blockchain transaction data based on an erasure code capable of implementing quick repair and access to part of original data with only a small amount of data by applying locally repairable codes (LRC) technique to data that needs to be accessed at high speed, in the distribution storage of transaction data to increase storage efficiency of nodes participating in blockchain in a blockchain network.

However, the problems to be solved by the present invention are not limited to the problems described above, and other problems may be present.

According to an aspect of the present invention, a method performed by a system for distribution storage of blockchain transaction data based on an erasure code includes: performing RS encoding on a predetermined number of blockchain transaction original data; and after the RS encoding is performed, applying LRC encoding technique to blockchain transaction original data (LRC-encoded original data), which needs to be accessed at high speed, among the RS-encoded transaction original data to encode and store the LRC-encoded original data, and repairing the LRC-encoded original data through decoding.

According to another aspect of the present invention, a system for distribution storage of blockchain transaction data based on an erasure code includes: an RS encoding device configured to perform RS encoding on a predetermined number of blockchain transaction original data; and an LRC encoding device configured to, after the RS encoding is performed, apply LRC encoding technique to blockchain transaction original data (LRC-encoded original data), which needs to be accessed at high speed, among the RS-encoded transaction original data to encode and store the LRC-encoded original data, and repair the LRC-encoded original data through decoding.

A computer program according to another aspect of the present invention for solving the above-described problem executes a method of distribution storage of blockchain transaction data based on an erasure code and is stored in a computer-readable recording medium.

Other specific details of the invention are included in the detailed description and drawings.

DETAILED DESCRIPTION

Figure 1A:
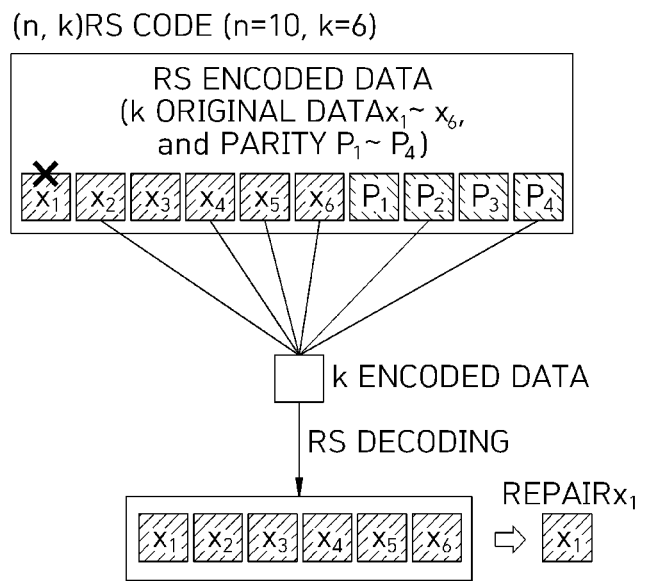
FIGS. 1A and 1B are diagrams for describing a method of repairing data based on an RS code and an LR-EC code.

Various advantages and features of the present invention and methods accomplishing them will become apparent from the following description of embodiments with reference to the accompanying drawings. However, the present invention is not limited to embodiments to be described below, but may be implemented in various different forms, these embodiments will be provided only in order to make the present invention complete and allow those skilled in the art to completely recognize the scope of the present invention, and the present invention will be defined by the scope of the claims.

Terms used in the present specification are for explaining embodiments rather than limiting the present invention. Unless otherwise stated, a singular form includes a plural form in the present specification. Throughout this specification, the term "comprise" and/or "comprising" will be understood to imply the inclusion of stated constituents but not the exclusion of any other constituents. Like reference numerals refer to like components throughout the specification and "and/or" includes each of the components mentioned and includes all combinations thereof. Although "first," "second," and the like are used to describe various components, it goes without saying that these components are not limited by these terms. These terms are used only to distinguish one component from other components. Therefore, it goes without saying that the first component mentioned below may be the second component within the technical scope of the present invention.

Unless defined otherwise, all terms (including technical and scientific terms) used in the present specification have the same meanings commonly understood by those skilled in the art to which the present invention pertains. In addition, terms defined in commonly used dictionary are not ideally or excessively interpreted unless explicitly defined otherwise.

Hereinafter, the background to which the present invention was conceived will be described to help those skilled in the art understand, and then the present invention will be described in detail.

When transaction data is redundantly stored in all participating nodes within a blockchain network, there is a problem in that data storage capacity that each node should bear increases. In order to solve these limitations related to blockchain transaction data storage, encoding technology is applied to distribute and store blockchain transaction data.

An erasure code (EC) is a technology that repairs original data with separate data (parity) prepared in advance when data is lost. The Reed-Solomon (RS) encoding technique, one of the representative ECs, requires as much data as the original data out of all encoded data in order to repair the original data.

The RS encoding technique encodes k original data together with m parities to generate n RS-encoded chunks. n RS-encoded chunks may be distributed and stored in n blockchain nodes to save storage space. Since the RS encoding technique has tolerance to fault equal to parity, the original data may be repaired using any k RS-encoded chunks.

The RS code-based distribution storage may save a storage space that one node should bear, but has the disadvantage that when a small number of blocks are lost, all blocks should be decoded to recover the lost blocks, so the access speed is very slow. When original blocks that need to be accessed at high speed are systematically stored redundantly, the lost original blocks may be repaired simply and quickly. However, as the number of blocks that need to be accessed at high speed increases, more original blocks should be stored, which requires more storage space.

Meanwhile, locally repairable codes (LRC) are a data repair method that increases repair efficiency by reducing the number of nodes accessed during the repair process of encoded data.

When the LRC encoding is additionally applied to r (<k) data that needs to be accessed at high speed, some of the original data may be quickly repaired with r encoding chunks smaller than k, thereby increasing accessibility compared to the RS codes. In this case, r may be much smaller than k, and k original data may have a plurality of LRC code application chunk groups having various r values.

In addition, rather than redundantly storing all original blocks that need to be accessed at high speed, only a small number of LRC parities generated as a result of the LRC encoding of the original blocks need to be stored, providing an appropriate compromise between the storage space and the accessibility. In this case, when the LRC encoding is applied, the LRC parity is additionally generated, but BFT may not be satisfied depending on the method of storing LRC parity.

To solve this problem, an embodiment of the present invention relates to a system and method for distribution storage of blockchain transaction data based on the locally repairable erasure code (LR-EC) code considering the BFT.

An embodiment of the present invention applies locally repairable code (LRC) technique to data that needs to be accessed at high speed in distribution storage of transaction data in order to increase storage efficiency of nodes participating in blockchain in a blockchain network to quickly repair and access part of the original data with only a small amount of data.

In addition, an embodiment of the present invention may select an optimized LRC management node and propose a method of storing LRC parity to ensure BFT and save storage space and communication costs.

Figure 1B:
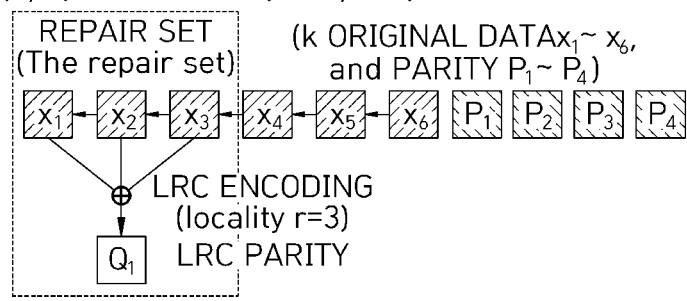

FIGS. 1A and 1B are diagrams for describing a method of repairing data based on an RS code and an LR-EC code. In this case, FIG. 1B is a diagram illustrating an example of applying a locally repairable code (LRC) to an RS code, as an embodiment of an LR-EC code.

First, referring to FIG. 1A, the RS encoding technique generates n=10 RS-encoded chunks by encoding k=7 original data $x_1$ to $x_7$ together with m=4 parities $P_1$ to $P_3$. In this case, since the RS code has tolerance to fault equal to parity, original data may be repaired using any number of RS-generated encoding chunks. When the original data $x_1$ is lost and thus needs to be repaired, $x_1$ may be repaired by collecting any 7 RS-encoded chunks among the RS-encoded chunks and performing RS decoding. However, since the RS decoding requires many RS-encoded chunks, an excessive communication bandwidth is consumed compared to data to be repaired, and the overall data transmission speed is also reduced.

Referring to FIG. 1B, when using the LR-EC code according to an embodiment of the present invention, LRC encoding is additionally applied to data that needs to be accessed at high speed after the RS encoding, so that some of original data that needs to be accessed at high speed may be quickly repaired with only fewer encoding chunks. For example, in the example of FIG. 1B where locality (r<k) is 3, the LRC encoding may be applied to original data $x_1$, $x_2$, and $x_3$ and LRC parity $Q_1$ may be generated to configure an LRC repair set L1={$x_1, x_2, x_3, Q_1$}. When $x_1$ is lost, $x_1$ may be repaired using the remaining three chunks that are not lost in the LRC repair set $L_1$. The embodiment of the present invention may use slightly more storage space than the RS code due to the additional generation of LRC parity, but may achieve the effect of significantly reducing the chunks required for repair.

Figure 2:
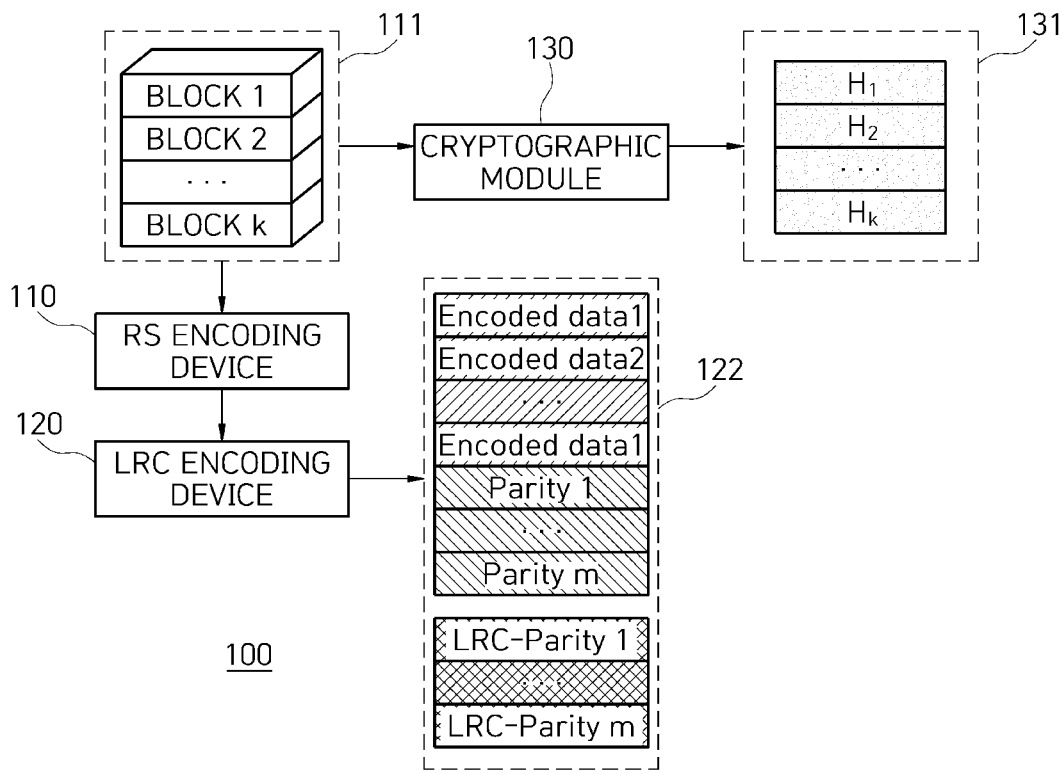
FIG. 2 is a diagram for describing a system for distribution storage of blockchain transaction data based on an erasure code according to an embodiment of the present invention.

FIG. 2 is a diagram for describing a system 100 for distribution storage of blockchain transaction data based on an erasure code according to an embodiment of the present invention.

A system 100 for distribution storage of blockchain transaction data according to an embodiment of the present invention includes a plurality of nodes, and each node includes an RS encoding device 110, an LRC encoding device 120, and a cryptographic module 130.

In an embodiment of the present invention, in order to save storage space for each node participating in a blockchain network, past data with low access frequency may be distributed and stored through an encoding technique. The latest data that is frequently accessed may be stored redundantly in all nodes as before, and past blocks that are accessed less frequently may be grouped as many as k (111) and distributed and stored by being RS-encoded through the RS encoding device 110.

After the RS encoding is performed, blockchain transaction original data (hereinafter referred to as LRC-encoded original data) that needs to be accessed at high speed among the RS-encoded blockchain transaction original data is additionally applied to LRC encoding through the LRC encoding device 120 to repair the LRC-encoded original data. Meanwhile, nodes participating in the blockchain network delete only chunks that the nodes want to store among all LR-EC encoding chunks 122.

Figure 3:
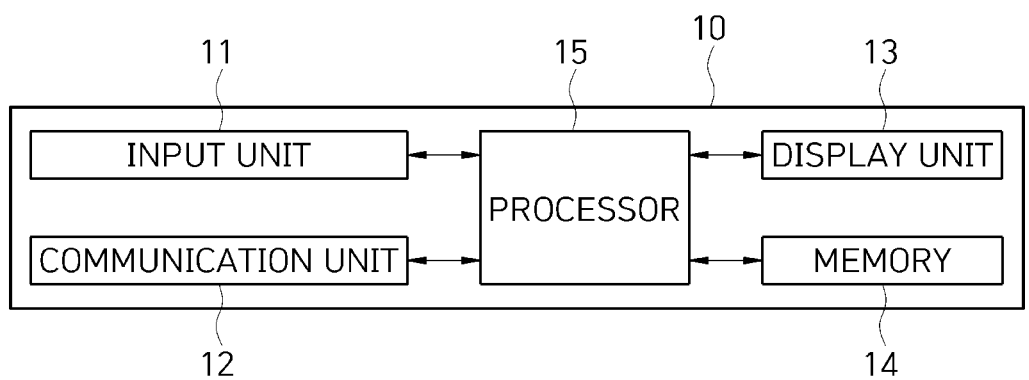
FIG. 3 is a diagram for describing a configuration of each node constituting the system for distribution storage of blockchain transaction data according to the embodiment of the present invention.

FIG. 3 is a diagram for describing a configuration of each node 10 constituting the system 100 for distribution storage of blockchain transaction data according to the embodiment of the present invention.

Each node 10 according to the embodiment of the present invention includes an input unit 11, a communication unit 12, a display unit 13, a memory 14, and a processor 15.

The input unit 11 generates input data in response to a user input of the node 10. The user input may include user input related to data to be processed by the node 10. The input unit 11 includes at least one input means. The input unit 11 may include a keyboard, a key pad, a dome switch, a touch panel, a touch key, a mouse, a menu button, and the like.

The communication unit 12 serves to transmit and receive data between internal components or communicate with external devices such as an external server and nodes. That is, the communication unit 12 may transmit and receive data between a plurality of nodes or to and from a central server as needed. The communication unit 12 may include both a wired communication module and a wireless communication module. The wired communication module may be implemented as a power line communication device, a telephone line communication device, cable home (MoCA), Ethernet, IEEE1294, an integrated wired home network, and an RS-485 control device. In addition, the wireless communication module may be configured in a module for implementing functions such as wireless LAN (WLAN), Bluetooth, HDR WPAN, UWB, ZigBee, Impulse Radio, 60 GHz WPAN, Binary-CDMA, wireless USB technology and wireless HDMI technology, 5th (5G) generation communication, long term evolution-advanced (LTE-A), long term evolution (LTE), and wireless fidelity (Wi-Fi).

The display unit 13 displays display data according to the operation of the node 10. The display unit 13 may include a liquid crystal display (LCD), a light emitting diode (LED) display, an organic LED (OLED) display, a micro electro mechanical systems (MEMS) display, and an electronic paper display. The display unit 13 may be coupled with the input unit 11 and implemented as a touch screen.

The memory 14 stores programs for distributed storage of erasure code-based blockchain transaction data. Here, the memory 14 collectively refers to a non-volatile storage device that continuously maintains stored information even when power is not supplied and a volatile storage device. For example, the memory 14 may include NAND flash memories such as a compact flash (CF) card, a secure digital (SD) card, a memory stick, a solid-state drive (SSD), and a micro SD card, magnetic computer storage devices such as a hard disk drive (HDD), and optical disc drives such as CD-ROM and DVD-ROM.

The processor 15 may execute software such as a program to control at least one other component (e.g., hardware or software component) of the node 10, and may perform various data processing or calculations.

Hereinafter, the method performed by the system 100 for distribution storage of blockchain transaction data based on an erasure code will be described with reference to FIGS. 4 to 14.

Figure 4:
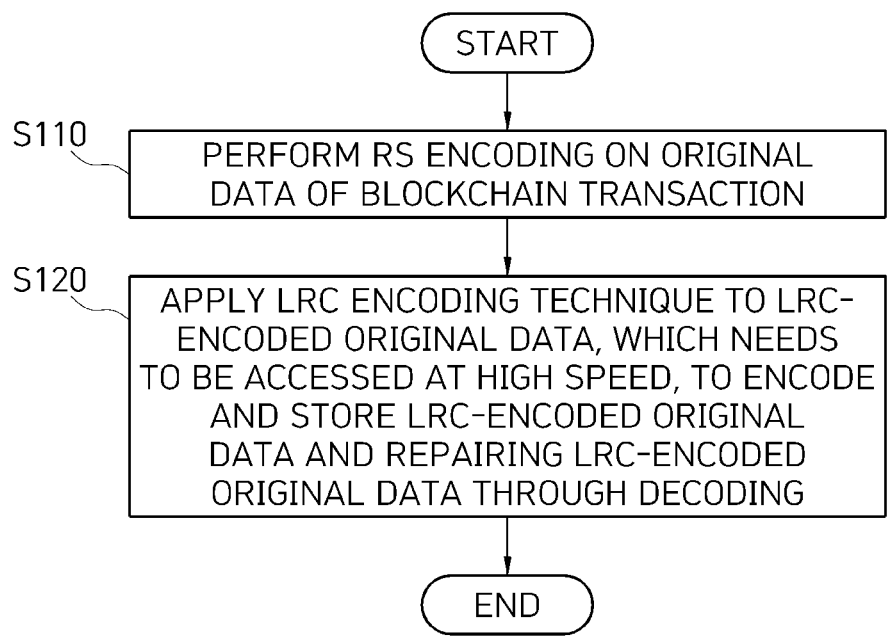
FIG. 4 is a flowchart of a method of distribution storage of blockchain transaction data based on an erasure code according to an embodiment of the present invention.

FIG. 4 is a flowchart of a method of distribution storage of blockchain transaction data based on an erasure code according to an embodiment of the present invention.

The blockchain a method of distribution and storage of blockchain transaction data according to an embodiment of the present invention first performs RS encoding on a predetermined number of blockchain transaction original data (S110).

Figure 5:
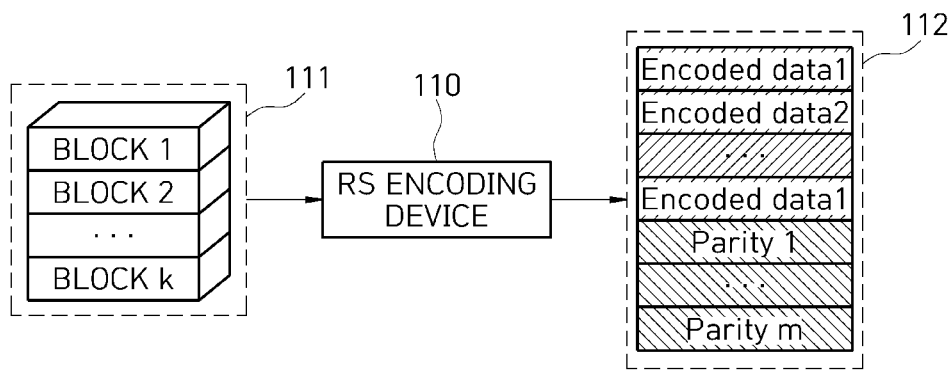
FIG. 5 is a diagram for describing an RS encoding operation of blockchain transaction data in an embodiment of the present invention.
Figure 6:
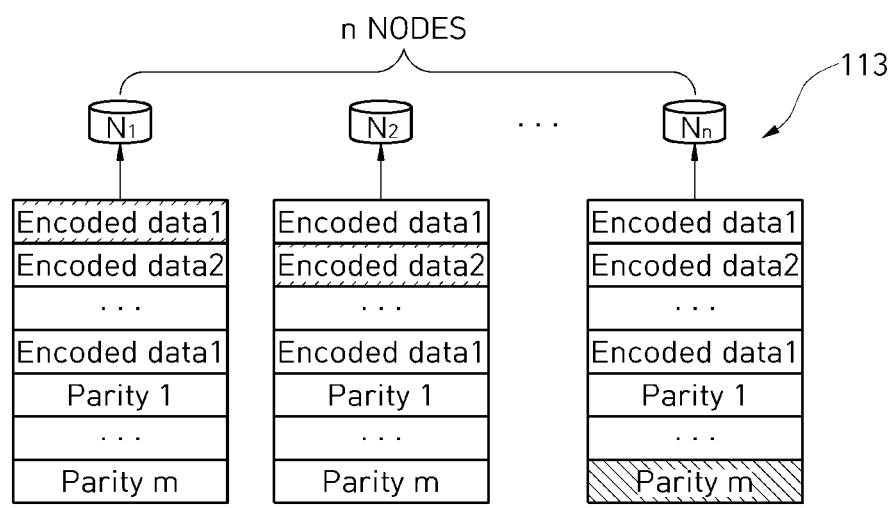
FIG. 6 is a diagram illustrating an example of distributed storage of an RS-encoded chunk in an embodiment of the present invention.

FIG. 5 is a diagram for describing an RS encoding operation of blockchain transaction data in an embodiment of the present invention. FIG. 6 is a diagram illustrating an example of distributed storage of an RS-encoded chunk in an embodiment of the present invention.

The latest data that satisfies predetermined recent time conditions and access frequency conditions of a predetermined number of times is stored redundantly in all nodes. In this case, k past blockchain transaction original data that does not satisfy the recent time conditions and access frequency may be set as blockchain transaction original data that performs RS encoding.

The RS encoding device 110 generates a total n (=k+m) of RS-encoded chunks 112 targeting k blocks 111 and a predetermined number of parities. In this case, the RS encoding technique is a systematic code, and the original blockchain transaction data is output in the encoded data as it is. Here, the systematic code refers to a code in which the blockchain transaction original data appears in the encoded output as it is.

Each blockchain node may distribute and store RS-encoded chunks 112 to each corresponding node, as illustrated in FIG. 6. In other words, among the RS-encoded chunks, only the RS-encoded chunks to be stored are deleted (113).

Figure 7:
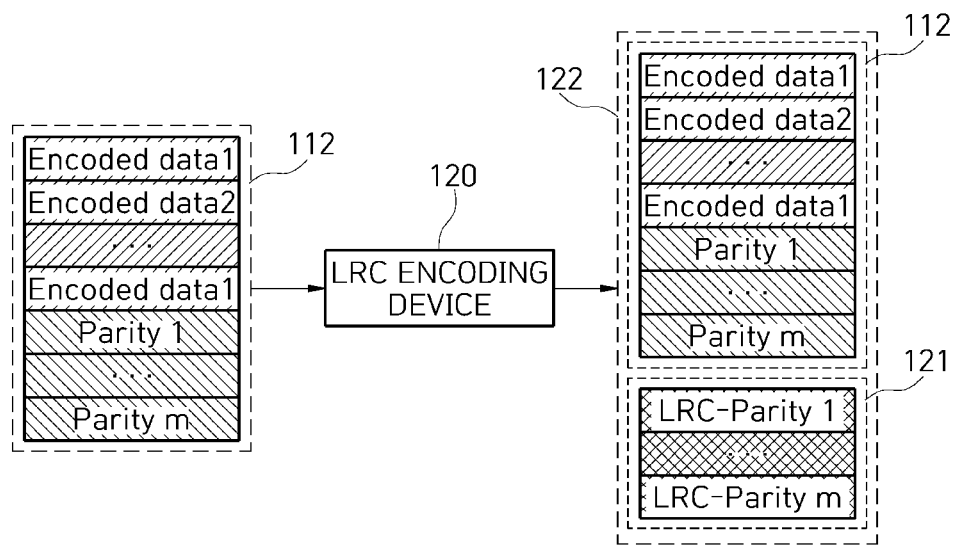
FIG. 7 is a diagram for describing an LRC encoding operation of blockchain transaction data in an embodiment of the present invention.

FIG. 7 is a diagram for describing an LRC encoding operation of blockchain transaction data in an embodiment of the present invention.

Next, after the RS encoding is performed, the LRC encoding technique is applied to LRC-encoded original data, which needs to be accessed at high speed, among the RS-encoded transaction original data to encode and store the LRC-encoded original data, and repairs the LRC-encoded original data through decoding (S120).

In this case, in an embodiment of the present invention, the LRC management node may be selected as one of the nodes that do not store LRC-encoded original data. The LRC management node may receive the RS-encoded chunk required to perform the LRC encoding from the node, and perform the LRC encoding using the received RS-encoded chunk as the LRC-encoded original data.

Specifically, the original data that needs to be accessed at high speed may be additionally encoded using the LRC encoding technique. When chunks that needs to be LRC-encoded are identified among the RS-encoded chunks 112 generated as a result of performing the RS encoding, one of the nodes that does not have the LRC-encoded original data 201 that needs to be accessed at high speed may be selected as the LRC management node. The selected LRC management node may receive the LRC-encoded original data 201 required to perform the LRC encoding from the node holding the corresponding chunk. Thereafter, the LRC management node performs the LRC encoding on the LRC-encoded original data 201 through the LRC encoding device 120.

In this case, the embodiment of the present invention stores the LRC-encoded chunk 121 generated as a result of performing the LRC encoding in the LRC management node, and deletes the LRC-encoded original data received by the LRC management node.

In addition, in the embodiment of the present invention, nodes storing LRC-encoded original data receive LRC-encoded original data that the nodes do not have from other nodes, generate an LRC-encoded chunk, and calculate a hash value. The corresponding nodes may only store only the hash value of the LRC-encoded chunk, and may delete the transmitted LRC-encoded original data and the LRC-encoded chunk.

Figure 8:
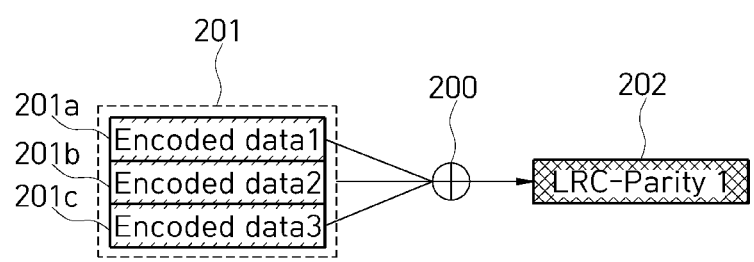
FIG. 8 is a diagram for describing contents of generating an LRC recovery set in an embodiment of the present invention.
Figure 9:
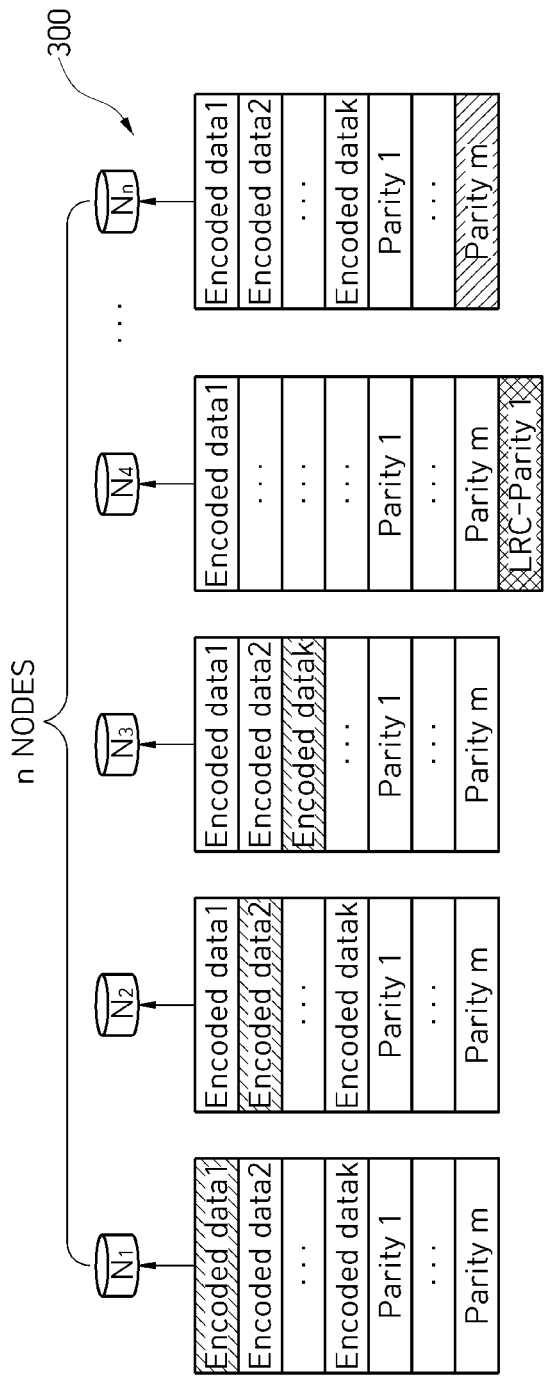
FIG. 9 is a diagram for describing an example of distributed storage of an LR-EC encoding chunk after LR-EC encoding in an embodiment of the present invention.

FIG. 8 is a diagram for describing contents of generating an LRC recovery set in an embodiment of the present invention. FIG. 9 is a diagram for describing an example of distributed storage of an LR-EC encoding chunk after LR-EC encoding in an embodiment of the present invention.

According to an embodiment of the present invention, data that is frequently called due to high correlation between the data may be organized into an LRC repair set. For example, the LRC repair set may be formed by grouping data generated during a specific period that has temporal correlation and temporal locality that is frequently called together.

As another example, the LRC repair set may be formed by grouping data that is close to each other. In this case, when data is lost, the decoding is possible through the LRC repair set located nearby, which may improve access speed compared to repairing the entire data. In this case, the number of data that may be included in the LRC repair set is called locality r. Here, r may be 0 or a positive number smaller than the number k of original data.

Referring to FIG. 8, LRC parity 202 may be generated by performing the LRC encoding 200 on the LRC-encoded original data 201 that needs to be accessed at high speed. When the LRC parity 202 is created, an LRC repair set including LRC-encoded original data 201a to 201c that need to be accessed at high speed and the LRC parity 202 may be generated.

For example, when access to any one 201a of the LRC-encoded original data 201a to 201c that need to be accessed at high speed becomes impossible, the LRC decoding is performed on the remaining data 201b, 201c, and 202 excluding the inaccessible LRC-encoded original data 201a in the LRC repair set, so the inaccessible LRC-encoded original data 201a may be repaired.

Referring to FIG. 9, in an embodiment of the present invention, the LRC management node performs the LRC encoding in FIG. 8, and leaves only the chunks that the LRC management node needs to store and the LRC parity 202 among the RS-encoded chunks 112 and deletes the rest. In addition, the nodes may only store only the hash value of the LRC-encoded chunk, and may delete the transmitted LRC-encoded original data and LRC-encoded chunk (300).

Meanwhile, the RS encoding technique may correct errors for faults equal to m parities when k original data generates n encoding chunks with m parities.

Describing practical Byzantine fault tolerance (PBFT) of the blockchain as an example, when there are f Byzantine nodes, parity m is greater than or equal to f, and when the total number n of nodes is greater than or equal to 3f+1, the blockchain network where transaction data is distributed and stored through (n, k)-RS encoding satisfies the PBFT.

However, when the LRC encoding is additionally applied, the LRC parity is additionally generated as many times as LRC encoding is performed. When the LRC parity is distributed and stored in additional nodes other than n blockchain nodes so that the LRC parity is not stored redundantly with the RS-encoded chunk, the total number of nodes is greater than n, so the PBFT may be broken.

To solve this problem, according to an embodiment of the present invention, the LRC parity generated to ensure the BFT may be redundantly stored in any one of the nodes storing the RS-encoded chunk generated as a result of performing the RS encoding. In this case, the BFT of the LR-EC code is ensured by the BFT of the RS code.

Figure 10:
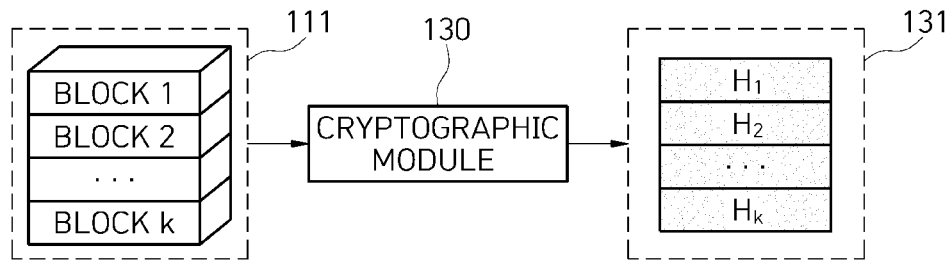
FIG. 10 is a diagram for describing a hashing process for verifying integrity of blockchain transaction original data in an embodiment of the present invention.

FIG. 10 is a diagram for describing a hashing process for verifying integrity of blockchain transaction original data in an embodiment of the present invention.

In an embodiment of the present invention, the integrity of the original data repaired through the RS-encoded chunks or the LR-EC encoded chunks may be quickly verified through comparison with the stored hash value.

Specifically, when the hash value for the blockchain transaction original data 111 is calculated through the cryptographic module 130, the hash value 131 for the blockchain transaction original data 111 is stored in all nodes participating in the blockchain network. In this case, all nodes each calculate and store hash values for the RS-encoded chunks and the LRC-encoded chunks, as well as the blockchain transaction original data. The integrity of the repaired LRC-encoded original data may be verified by comparing the hash value for the blockchain transaction original data with the repaired LRC-encoded original data.

In this case, after the RS encoding, all the nodes may calculate and store the hash value for the RS-encoded chunk, and then delete other RS-encoded chunks, leaving only the RS-encoded chunks that the all the nodes need to store.

In addition, after the LRC encoding, nodes that have the LRC-encoded original data may receive the remaining LRC-encoded original data that the nodes do not have from other nodes, generate the LRC-encoded chunks (LRC parity), calculate the hash value for the LRC-encoded chunk and then delete the LRC-encoded chunk, and store only the hash value for the LRC-encoded chunk.

Figure 11:
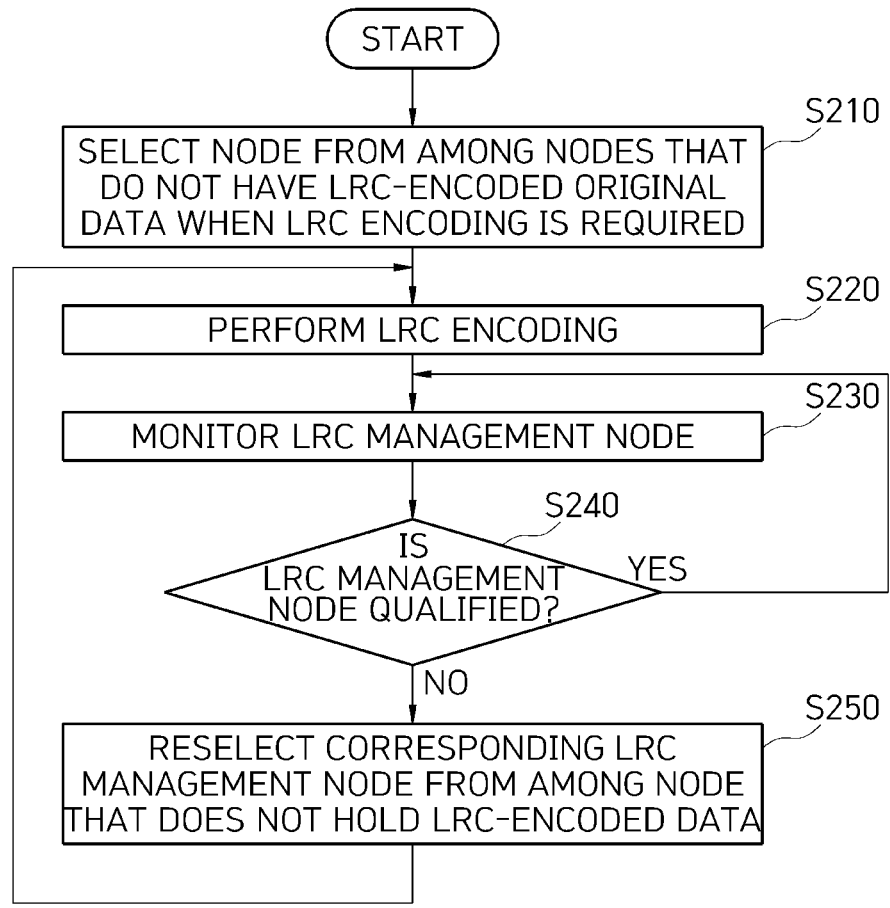
FIG. 11 is a diagram for describing contents of selecting an LRC management set in an embodiment of the present invention.

FIG. 11 is a diagram for describing contents of selecting an LRC management set in an embodiment of the present invention.

In one embodiment of the present invention, the LRC management node is selected from among nodes that do not have LRC-encoded original data at the time LRC encoding is required (S210).

Thereafter, the selected LRC management node performs the LRC encoding through the LRC encoding device 120 (S220).

Thereafter, resource information considering the storage space and communication performance of the LRC management node and whether there is a Byzantine node are continuously monitored (S230) to check the qualification of the LRC management node (S240). When the qualification of the LRC management node is insufficient (S240—N), the corresponding LRC management node may be reselected (S250). In this case, the LRC management node may be reselected from among nodes that do not have the LRC-encoded original data which is handled by an LRC management node with insufficient qualifications.

Thereafter, the reselected LRC management node performs the LRC encoding through the LRC encoding device 120, and replaces the existing LRC parity with new LRC parity and stores the new LRC parity (S220).

Hereinafter, in an embodiment of the present invention, an LRC index table that manages the LRC repair set and the LRC management node information will be described.

In an embodiment, the present invention may generate the LRC index table including information on the LRC repair set and the LRC management node generated in each coding round in which the RS encoding and the LRC encoding are performed.

TABLE 1

| Coding round | LRC management node | LRC repair set |
|---|---|---|
| $R_1$ | $N_4$ | $L_1^1 = \{x_1^1, x_1^2, x_1^3, Q_1^1\}$ |
| $R_2$ | $N_7$ | $L_2^1 = \{x_2^1, x_2^2, x_2^3, Q_2^1\}$ |
|  | $N_5$ | $L_2^2 = \{x_2^1, x_2^4, x_2^6, Q_2^3\}$ |

Referring to Table 1, the information on the LRC repair set and the LRC management node may be stored in a status DB shared by all nodes in the form of the LRC index table.

For the example in Table 1, in a first coding round $R_1$, $N_4$ is the LRC management node, and the LRC repair set includes $L_1^1 = \{x_1^1, x_1^2, x_1^3, Q_1^1\}$. In this case, the coding round is a series of processes that collect k blocks and perform the RS encoding and the LRC encoding. Also, $L_g^h$ refers to an h-th LRC repair set of a g-th coding round.

It can be seen that LRC parity $Q_1^1$ for repairing original data of $L_1^1$ is stored in the LRC management node $N_4$. In the second coding round $R_2$ in the example, among nodes that do not have the LRC-encoded original data, nodes $N_7$ and $N_5$ that satisfy the qualification of the LRC management node are selected as the LRC management nodes for each LRC repair set. In the coding round $R_2$, the LRC management node $N_7$ stores LRC parity $Q_2^1$ of an LRC repair set $L_2^1$, and the next LRC management node $N_5$ stores LRC parity $Q_2^2$ of an LRC repair set $L_2^2$.

Meanwhile, among the LRC repair sets stored in the LRC index table, the LRC repair set with a usage frequency less than a preset threshold may be deleted.

Figure 12:
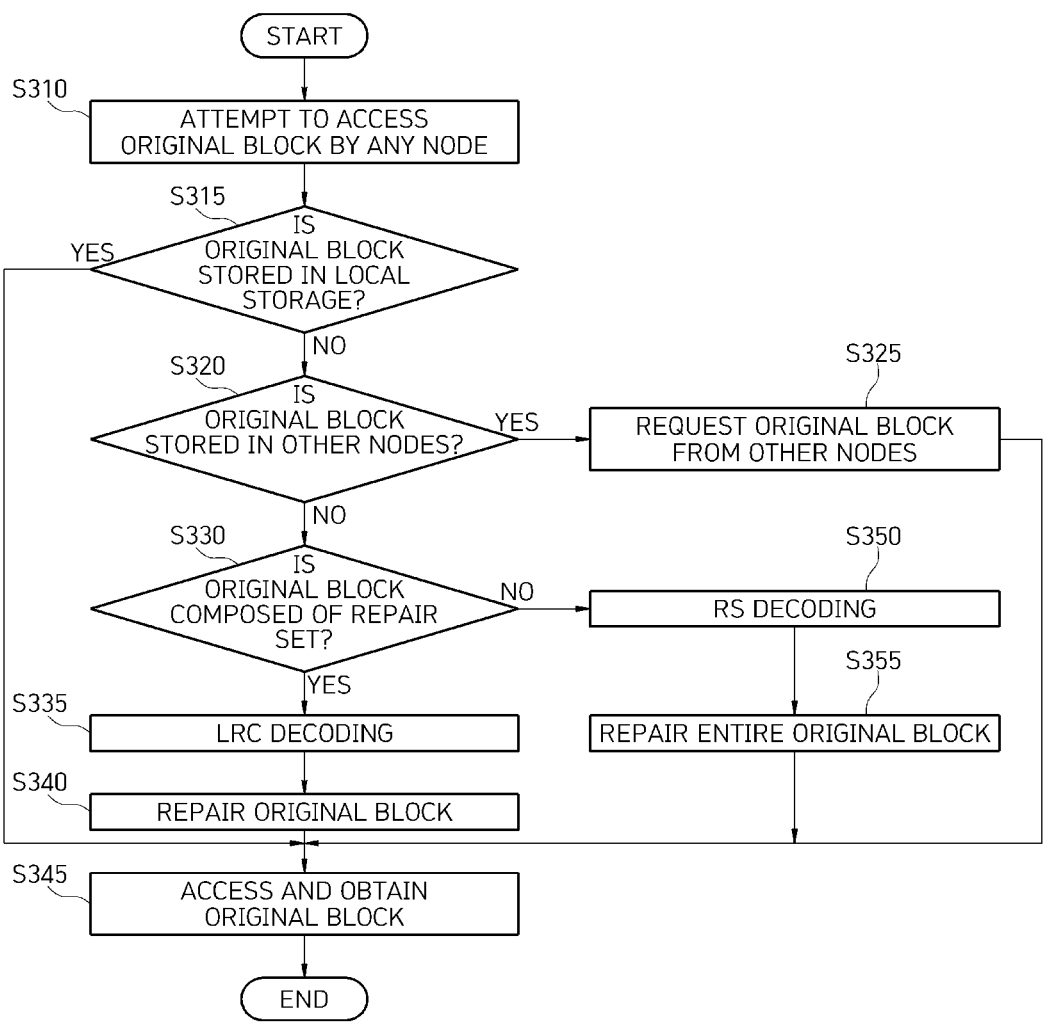
FIG. 12 is a diagram for describing a process of high-speed recovery of blockchain transaction data by performing LRC decoding in an embodiment of the present invention.

FIG. 12 is a diagram for describing a process of high-speed recovery of blockchain transaction data by performing LRC decoding in an embodiment of the present invention.

First, when any node Ni attempts to access an original block $B_t$ (S310), it is first checked whether the original block $B_t$ is stored in its own local storage (S315). As a result of the confirmation, when the original block $B_t$ is stored in its own local storage (S315—Y), after immediately accessing the local storage to obtain the original block $B_t$, a repair process ends (S345).

On the other hand, when the original block $B_t$ is not stored in the local storage (S315—N), it is checked whether the original block $B_t$ is stored in another node $N_j$ (S320). As a result of confirmation, when the original block $B_t$ is stored in another node $N_j$ (S320—Y), the original block $B_t$ is requested from the corresponding node $N_j$ (S325) to receive the original block $B_t$ (S345), and the repair process ends.

However, when the original block $B_t$ may not be received from any node in the blockchain network (S320—N), the corresponding node performs the LRC decoding to repair the original block $B_t$ (S335). In this case, when the original block $B_t$ is composed of the LRC repair set in the LRC index table (S330—Y), the LRC management node corresponding to the original block $B_t$ repairs the original block $B_t$ (S340) through the LRC decoding (S335) and transmits the repaired original block $B_t$ to a node Ni (S345). Thereafter, after the node Ni verifies the authenticity of the original block $B_t$ received through the comparison of the hash value, the repair process ends.

Meanwhile, when the original block $B_t$ is not comprised of the LRC repair set (S330—N), after the node attempting to access the original block $B_t$ repairs the entire original block (S355) through the RS decoding (S350) to obtain the original block $B_t$ (S345), the repair process ends.

Figure 13:
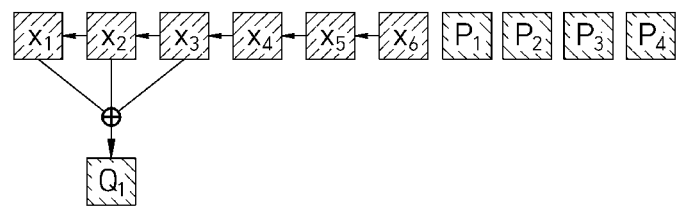
FIG. 13 is a diagram illustrating an example of application of a provisional locality-based LR-EC code.
Figure 13:
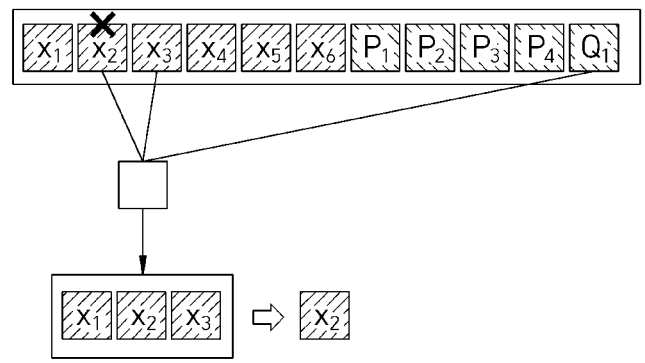

FIG. 13 is a diagram illustrating an example of application of a provisional locality-based LR-EC code.

In an embodiment, when original data generated during a specific period have a temporal correlation and are frequently called together, it is possible to increase accessibility by grouping and managing original data having temporal locality with an LRC.

For example, as illustrated in FIG. 13, by applying LRC to original data $x_2$, $x_3$, and $x_4$ generated from June 1 to June 30 among all six original data $x_1$ to $x_6$, data during the corresponding period may be quickly repaired.

Figure 14:
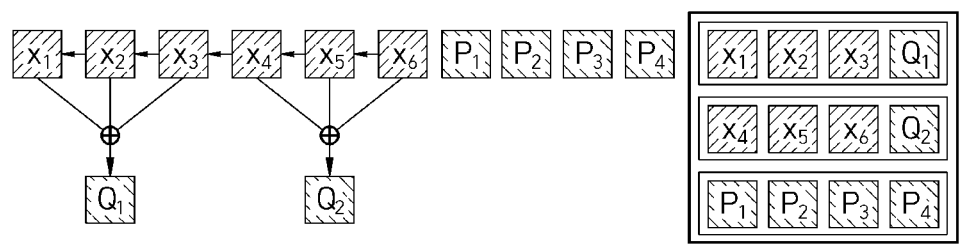
FIG. 14 is a diagram illustrating an example of application of a spatial locality-based LR-EC code.

FIG. 14 is a diagram illustrating an example of application of a spatial locality-based LR-EC code.

In an embodiment, it is possible to increase accessibility by applying LRC to blockchain transaction original data $x_1$ to $x_3$ that are close in distance.

For example, as illustrated in FIG. 14, by storing local data in the same server rack and decoding the local data, data transmission and repair speed may be reduced by allowing data to be transmitted between nodes in the same rack.

Figure 15:
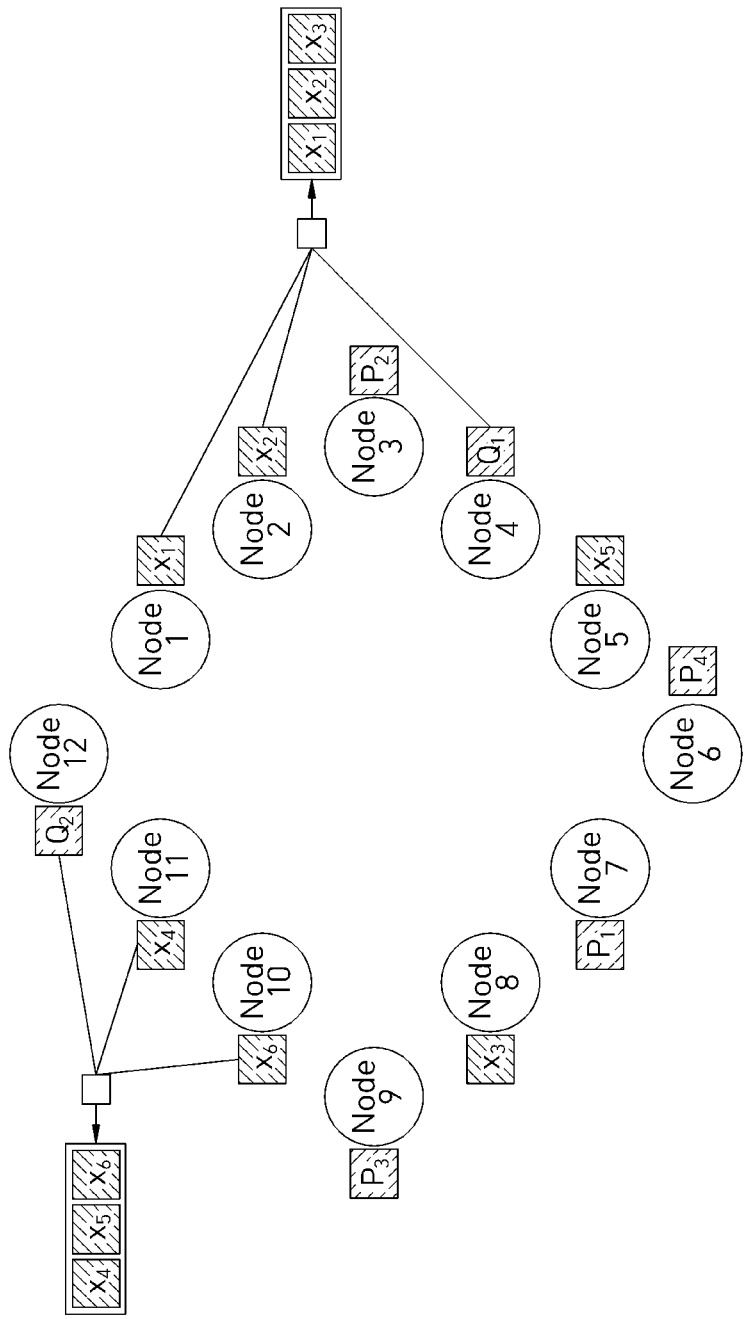
FIG. 15 is a diagram illustrating another example of application of the spatial locality-based LR-EC code.

FIG. 15 is a diagram illustrating another example of application of the spatial locality-based LR-EC code.

In an embodiment, when a physical distance is long or a logical distance between nodes is long depending on routing algorithm, communication topology, data structure, etc., it is possible to increase accessibility using LRC.

For example, in a distributed storage structure such as a distributed hash table, when distributed nodes have ring topology as shown in FIG. 15, long-distance data $[x_3, x_5]$ may be quickly accessed by repairing LRC-encoded data only with data $[x_1, x_2, Q_1]$, $[x_4, x_6, Q_2]$ that is close in distance.

Figure 1B:
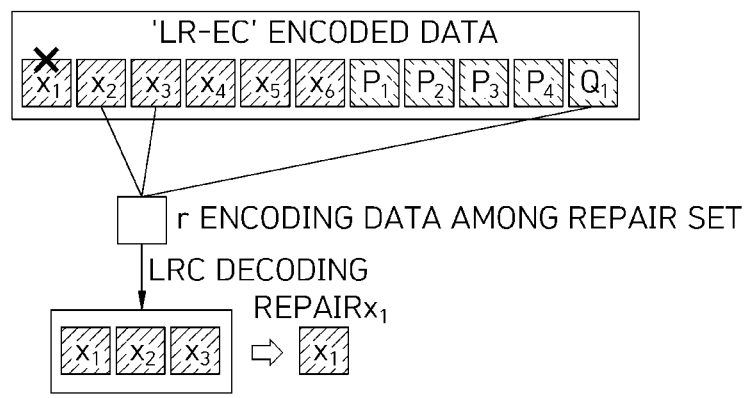

Meanwhile, in the above description, steps S110 to S355 may be further divided into additional steps or combined into fewer operations according to an implementation example of the present invention. Also, some steps may be omitted if necessary, and an order between the operations may be changed. In addition, even if other content is omitted, the contents described in FIGS. 1 to 3 and the contents described in FIGS. 4 to 14 may be mutually applied.

The method of distribution storage of blockchain transaction data based on an erasure code according to an embodiment of the present invention described above may be implemented as a program (or application) and stored in a medium to be executed in combination with a computer that is hardware.

In order for the computer to read the program and execute the methods implemented as the program, the program may include a code coded in a computer language such as C, C++, JAVA, Ruby, or machine language that the processor (CPU) of the computer may read through a device interface of the computer. Such code may include functional code related to a function or such defining functions necessary for executing the methods and include an execution procedure related control code necessary for the processor of the computer to execute the functions according to a predetermined procedure. In addition, the code may further include a memory reference related code for which location (address street number) in an internal or external memory of the computer the additional information or media necessary for the processor of the computer to execute the functions is to be referenced at. In addition, when the processor of the computer needs to communicate with any other computers, servers, or the like located remotely in order to execute the above functions, the code may further include a communication-related code for how to communicate with any other computers, servers, or the like using the communication module of the computer, what information or media to transmit/receive during communication, and the like.

The storage medium is not a medium that stores images therein for a while, such as a register, a cache, a memory, or the like, but means a medium that semi-permanently stores the images therein and is readable by an apparatus. Specifically, examples of the storage medium include, but are not limited to, ROM, random-access memory (RAM), CD-ROM, a magnetic tape, a floppy disk, an optical image storage device, and the like. That is, the program may be stored in various recording media on various servers accessible by the computer or in various recording media on the computer of the user. In addition, media may be distributed in a computer system connected by a network, and a computer-readable code may be stored in a distributed manner.

According to the locally repairable erasure (LR-EC) code applied to an embodiment of the present invention, it is possible to slightly increase the storage overhead compared to the RS code, but quickly repair important data that needs to be accessed at high speed and data that is likely to be lost.

In particular, when the data that needs to be accessed at high speed is encoded using the LR-EC code, it is possible to locally repair data using only r data smaller than k.

Accordingly, it is possible to implement faster data access compared to the RS code by reducing communication costs such as the data transmission bandwidth and transmission time for data repair. In addition, the fault tolerance and access speed may be slightly lower than when storing the original block redundantly, but the storage costs can be significantly reduced while the BFT is satisfactory.

The effects of the present invention are not limited to the above-described effects, and other effects that are not mentioned may be obviously understood by those skilled in the art from the following description.

The above description of the present invention is for illustrative purposes, and those skilled in the art to which the present invention pertains will understand that it may be easily modified to other specific forms without changing the technical spirit or essential features of the present invention. Therefore, it should be understood that the above-mentioned embodiments are exemplary in all aspects but are not limited thereto. For example, each component described as a single type may be implemented in a distributed manner, and similarly, components described as distributed may be implemented in a combined form.

It is to be understood that the scope of the present invention will be defined by the claims rather than the above-described description and all modifications and alternations derived from the claims and their equivalents are included in the scope of the present invention.

What is claimed is:

1. A method performed by a system for distribution storage of blockchain transaction data based on an erasure code, the method comprising:
   performing RS encoding on a predetermined number of blockchain transaction original data; and
   after the RS encoding is performed, applying LRC encoding technique to blockchain transaction original data (LRC-encoded original data), which needs to be accessed at high speed, among the RS-encoded transaction original data to encode and store the LRC-encoded original data, and repairing the LRC-encoded original data through decoding.

2. The method of claim 1, further comprising:
   redundantly storing latest data, which satisfies a predetermined recent time condition and a predetermined number of access frequency conditions, in all nodes,
   wherein the performing of the RS encoding on the predetermined number of blockchain transaction original data includes setting past data that does not satisfy the recent time condition and access frequency conditions as the blockchain transaction original data to be the RS encoded.

3. The method of claim 2, wherein the performing of the RS encoding on the predetermined number of blockchain transaction original data includes:
   generating an RS-encoded chunk based on the blockchain transaction original data and a predetermined number of parities; and
   distributing and storing the RS-encoded chunk to each corresponding node.

4. The method of claim 1, wherein the applying of the LRC encoding technique to encode and store the LRC-encoded original data and repairing the LRC-encoded original data through the decoding includes:
   selecting an LRC management node for one of the nodes that do not store the LRC-encoded original data;
   receiving, by the LRC management node, the LRC-encoded original data required to perform LRC encoding from a node holding the LRC-encoded original data; and
   performing the LRC encoding on the received LRC-encoded original data.

5. The method of claim 4, wherein the applying of the LRC encoding technique to encode and store the LRC-encoded original data and repairing the LRC-encoded original data through the decoding includes:
   storing an LRC encoding chunk generated as a result of performing the LRC encoding in the LRC management node; and
   deleting the LRC-encoded original data received from the LRC management node.

6. The method of claim 4, wherein the applying of the LRC encoding technique to encode and store the LRC-encoded original data and repairing the LRC-encoded original data through the decoding includes:
receiving, by a node storing the LRC-encoded original data, other LRC-encoded original data different from the stored LRC-encoded original data from other nodes;
generating an LRC-encoded chunk based on the LRC-encoded original data and the other LRC-encoded original data at the node;
calculating a hash value based on the generated LRC-encoded chunk; and
storing the hash value and deleting the other LRC-encoded original data and the LRC-encoded chunk.

7. The method of claim 4, wherein the applying of the LRC encoding technique to repair the LRC-encoded original data includes re-selecting the LRC management node based on at least one of resource information of the LRC management node, whether there is a Byzantine node, and whether the LRC-encoded original data is stored.

8. The method of claim 1, wherein the applying of the LRC encoding technique to encode and store the LRC-encoded original data and repairing the LRC-encoded original data through the decoding includes:
performing the LRC encoding on the LRC-encoded original data to generate an LRC parity; and
generating an LRC repair set including the LRC-encoded original data and the LRC parity.

9. The method of claim 8, wherein the applying of the LRC encoding technique to encode and store the LRC-encoded original data and repairing the LRC-encoded original data through the decoding includes redundantly storing the generated LRC parity in any of the nodes storing the RS-encoded chunk generated as a result of performing the RS encoding.

10. The method of claim 8, wherein the applying of the LRC encoding technique to encode and store the LRC-encoded original data and repairing the LRC-encoded original data through the decoding further includes, when access to any one of the LRC-encoded original data becomes impossible, LRC decoding is performed on the remaining data excluding the inaccessible LRC-encoded original data in the LRC repair set to repair the inaccessible LRC-encoded original data.

11. The method of claim 8, wherein the applying of the LRC encoding technique to encode and store the LRC-encoded original data and repairing the LRC-encoded original data through the decoding further includes generating an LRC index table including information on the generated LRC repair set and LRC management node at each coding round in which the RS encoding and LRC encoding are performed.

12. The method of claim 11, wherein the generating of the LRC index table includes deleting an LRC repair set having a usage frequency less than a preset threshold from among a plurality of LRC repair sets stored in the LRC index table.

13. The method of claim 8, further comprising:
performing, by an LRC management node, the LRC decoding on the blockchain transaction original data included in the LRC repair set with any node attempting to access the blockchain transaction original data; and
transmitting, by the LRC management node, the repaired blockchain transaction original data as the LRC decoding is performed to the node attempting the access.

14. The method of claim 13, wherein when the LRC repair set does not include the blockchain transaction original data, any node attempting to access the blockchain transaction original data performs RS decoding to obtain the blockchain transaction original data and ends a repair process.

15. The method of claim 13, wherein when the blockchain transaction original data is stored in its own local storage, any node attempting to access the blockchain transaction original data obtains the blockchain transaction original data through the local storage and ends a repair process.

16. The method of claim 13, wherein when the blockchain transaction original data is stored in other nodes, any node attempting to access the blockchain transaction original data requests and receives the blockchain transaction original data from the other nodes and then ends the repair process.

17. The method of claim 1, further comprising:
calculating a hash value for the blockchain transaction original data;
storing the hash value for the blockchain transaction original data in all nodes; and
verifying integrity of the repaired LRC-encoded original data by comparing the hash value for the blockchain transaction original data with the repaired LRC-encoded original data.

18. A system for distribution storage of blockchain transaction data based on an erasure code, the system comprising:
an RS encoding device configured to perform RS encoding on a predetermined number of blockchain transaction original data; and
an LRC encoding device configured to, after the RS encoding is performed, apply LRC encoding technique to blockchain transaction original data (LRC-encoded original data), which needs to be accessed at high speed, among the RS-encoded transaction original data to encode and store the LRC-encoded original data, and repair the LRC-encoded original data through decoding.

* * * * *